(12) United States Patent
Choi et al.

(10) Patent No.: US 10,394,064 B2
(45) Date of Patent: Aug. 27, 2019

(54) DISPLAY APPARATUS

(71) Applicant: SAMSUNG ELECTRONICS CO., LTD., Suwon-si (KR)

(72) Inventors: Hyun Yong Choi, Suwon-si (KR); Ha Na Kim, Suwon-si (KR); Jun Yong Park, Suwon-si (KR); Jee Hoon Park, Seoul (KR); You Na Choo, Seongnam-si (KR); Soo Hyun Whang, Seoul (KR); Gyu Sung Do, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/726,614

(22) Filed: Oct. 6, 2017

(65) Prior Publication Data
US 2018/0101050 A1 Apr. 12, 2018

(30) Foreign Application Priority Data
Oct. 6, 2016 (KR) .................. 10-2016-0128978

(51) Int. Cl.
*H05K 9/00* (2006.01)
*G02F 1/1333* (2006.01)
*G02F 1/1335* (2006.01)

(52) U.S. Cl.
CPC .. *G02F 1/133308* (2013.01); *G02F 1/133524* (2013.01); *H05K 9/0096* (2013.01); *G02F 2001/13332* (2013.01); *G02F 2001/133562* (2013.01); *G02F 2203/24* (2013.01)

(58) Field of Classification Search
CPC ............... G02F 1/133308; G02F 1/133524

USPC ......................................... 361/807
See application file for complete search history.

(56) References Cited

U.S. PATENT DOCUMENTS

| | | | |
|---|---|---|---|
| 8,541,934 B2 * | 9/2013 | Watanabe | G02F 1/13336 313/110 |
| 2003/0067739 A1 | 4/2003 | Kim et al. | |
| 2003/0067740 A1 | 4/2003 | Kim et al. | |
| 2004/0165346 A1 | 8/2004 | Kim et al. | |
| 2011/0222218 A1 * | 9/2011 | Kim | H04N 5/645 361/679.01 |
| 2012/0049718 A1 * | 3/2012 | Watanabe | G02F 1/13336 313/110 |

(Continued)

FOREIGN PATENT DOCUMENTS

| | | | |
|---|---|---|---|
| JP | 2009-86116 A | 4/2009 | |
| JP | 2009086116 | * 4/2009 | ............ G09F 9/00 |

OTHER PUBLICATIONS

Communication issued by the European Patent Office dated Feb. 1, 2018 in counterpart European Patent Application No. 17194800.3.

(Continued)

*Primary Examiner* — Hoa C Nguyen
*Assistant Examiner* — Keith DePew
(74) *Attorney, Agent, or Firm* — Sughrue Mion, PLLC

(57) ABSTRACT

A display apparatus is provided. The display apparatus includes a display panel that displays an image in a forward direction thereof; a bezel disposed on an edge of the display panel; and a light refraction member disposed in front of the bezel, the light refraction member including a transparent material, and refracting light of an outer rear side of the bezel in a forward direction of the bezel.

19 Claims, 17 Drawing Sheets

(56) References Cited

U.S. PATENT DOCUMENTS

2016/0139460 A1* 5/2016 Takase .................... G02B 3/08
349/57

OTHER PUBLICATIONS

Communication dated Sep. 7, 2018 issued by the European Patent Office in counterpart European Application No. 17 194 800.3.
Communication dated Apr. 12, 2019 by the European Patent Office in counterpart European Patent Application No. 17 194 800.3.

* cited by examiner

DISPLAY APPARATUS

CROSS-REFERENCE TO RELATED APPLICATION

This application claims priority from Korean Patent Application No. 10-2016-0128978, filed on Oct. 6, 2016 in the Korean Intellectual Property Office, the disclosure of which is incorporated by reference herein in its entirety.

BACKGROUND

1. Field

Apparatuses and devices consistent with the present disclosure relate to a display apparatus in which a bezel side of the display apparatus is improved.

2. Description of Related Art

Generally, a display apparatus is an apparatus configured to display a screen and includes a monitor or television. A display apparatus uses a self-luminous display panel including an organic light emitting diode (OLED) or a light-receiving display panel including a liquid crystal display (LCD) panel.

Recently, development for forming a display apparatus which includes a slim bezel or excludes a bezel has been continuously conducted to improve aesthetics of an exterior of the display apparatus.

SUMMARY

It is an aspect to provide a display apparatus in which a bezel is hidden such that a user does not recognize the bezel of the display apparatus.

Additional aspects will be set forth in part in the description which follows and, in part, will be apparent from the description, or may be learned by practice of the exemplary embodiments described herein.

In accordance with an aspect of an exemplary embodiment, there is provided a display apparatus that includes a display panel configured to display an image in a forward direction thereof; a bezel disposed on an edge of the display panel; and a light refraction member disposed in front of the bezel, the light refraction member including a transparent material, and configured to refract light of an outer rear side of the bezel in a forward direction of the bezel.

The light refraction member may include a refraction surface disposed to be inclined in the forward direction from an inside of the bezel to an outside thereof; and the refraction surface may refract the light of the outer rear side of the bezel in the forward direction of the bezel.

A front end of the refraction surface may be disposed further outward than the bezel; and a rear end of the refraction surface may be disposed on a region of the edge of the display panel.

The light refraction member may further include a coupler portion configured to extend to a rear side of the refraction surface and to be coupled to the bezel.

The coupler portion may include an insertion groove into which at least a part of the bezel is inserted.

The coupler portion may be hook-coupled to the at least a portion of the bezel.

The light refraction member may include an extension portion configured to connect the refraction surface and the coupler portion, the extension portion extending in the forward direction of the display panel.

A first width of the light refraction member may be greater than a second width of the bezel.

The bezel may include four length portions configured to extend along four sides of the display panel, respectively, and the light refraction member may be provided in front of at least three length portions among the four length portions.

The light refraction member may be provided in front of the four length portions.

The display apparatus may further comprise a reflection member provided between a front side of the bezel and the light refraction member.

The display apparatus may further comprise an illumination sensor interposed between the bezel and the light refraction member.

A pattern or letter shape may be provided on the refraction surface.

According to another aspect of an exemplary embodiment, there is provided a display apparatus mounted on a wall surface, the display apparatus comprising a display panel configured to display an image in a forward direction thereof; a bezel disposed on an edge of the display panel; and a light refraction member disposed in front of the bezel and including a transparent material, wherein the light refraction member refracts light reflected by the wall surface adjacent to the bezel in a forward direction of the bezel in order to hide a shape of the bezel.

The display panel may include an image non-display region along edges of the display panel, and the light refraction member may refract the light reflected by the wall surface in a forward direction of the bezel and in a forward direction of the image non-display region in order to hide a first shape of the bezel and a second shape of the image non-display region.

The light refraction member may have a first end and a second end in a width direction, and the first end of the light refraction member may be disposed further outward than the bezel; and the second end of the light refraction member may be provided to correspond to the image non-display region.

The light refraction member may include a refraction surface provided to be inclined in the forward direction from an inside of the bezel to an outside of the bezel; and the refraction surface may refract light of the wall surface adjacent to the bezel in the forward direction of the bezel.

The light refraction member may include a coupler portion provided to extend to a rear side of the refraction surface and configured to be in contact with the bezel.

The display apparatus may further comprise a bottom chassis disposed behind the display panel, wherein the bottom chassis includes a coupling protrusion configured to protrude toward the coupler portion to be coupled to the coupler portion; and the coupler portion includes an insertion groove into which the coupling protrusion is inserted when the coupler portion is coupled to the bezel.

According to another aspect of an exemplary embodiment, there is provided a display apparatus comprising a display panel including a display region, in which an image is displayed in a forward direction thereof and a non-display region formed along edges of the display region, and having a rectangular shape; a bezel disposed on an edge of the display panel; and a light refraction member disposed in front of the bezel and the non-display region and including a refraction surface disposed to be inclined in the forward direction from an inside edge of the bezel to an outer edge of the bezel, wherein the refraction surface includes a transparent material, reflects light of an outer rear side of the edge of the bezel toward an inside of the outer edge of the bezel, in order to hide the bezel and the non-display region.

BRIEF DESCRIPTION OF THE DRAWINGS

These and/or other aspects will become apparent and more readily appreciated from the following description of various exemplary embodiments, taken in conjunction with the accompanying drawings of which.

DETAILED DESCRIPTION

Figure 1:
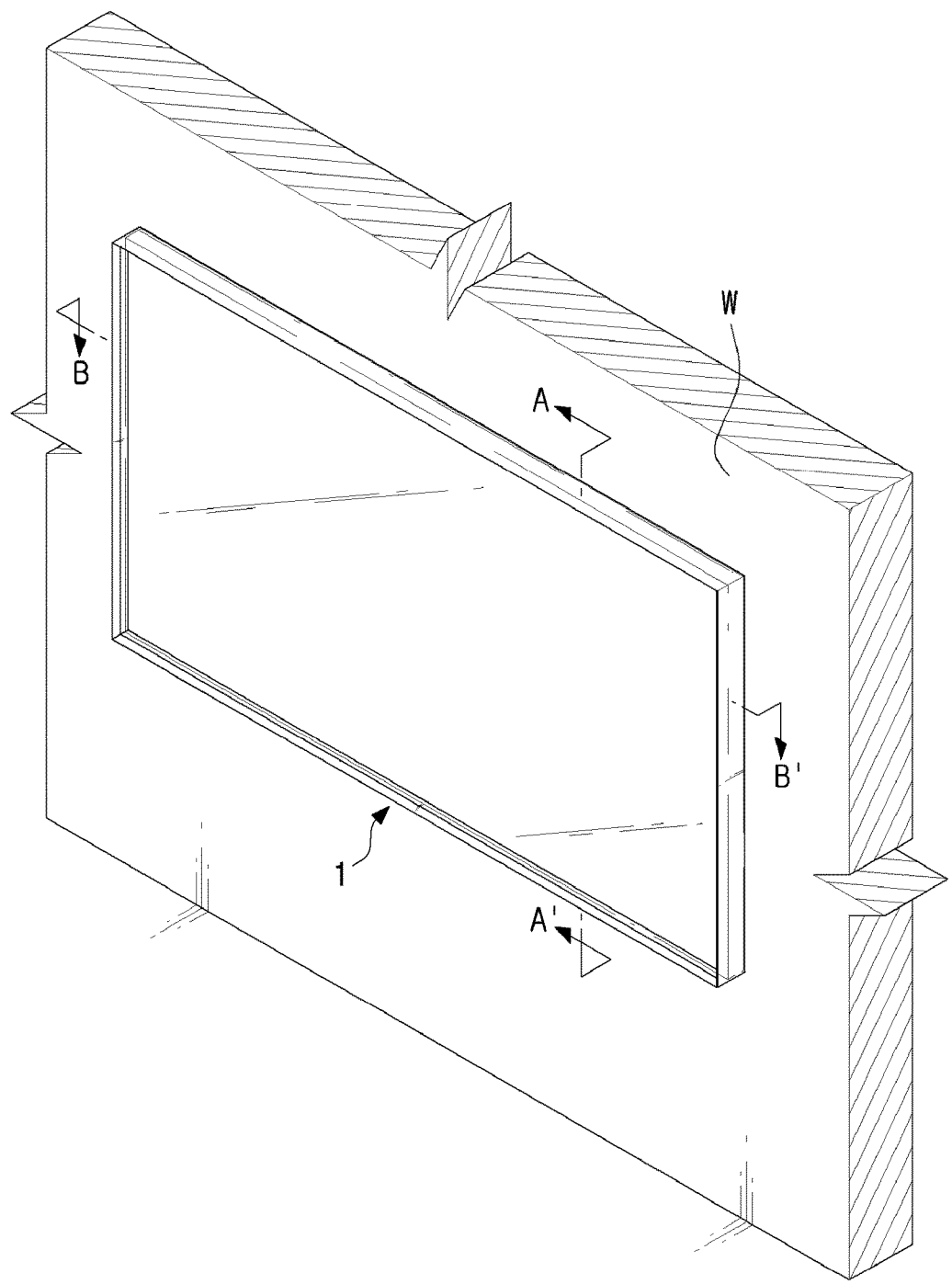
FIG. 1 is a perspective view illustrating a display apparatus according to an exemplary embodiment.

Exemplary embodiments described in this specification and configurations illustrated in drawings are only exemplary examples of the disclosed display apparatus. The disclosure covers various modifications that may be substituted for the exemplary embodiments and drawings herein at the time of filing of this application.

In addition, the same reference numerals or symbols refer to parts or elements that perform substantially the same function.

In addition, terms used in the present specification are merely used to describe exemplary embodiments and are not intended to limit and/or restrict the exemplary embodiments. An expression used in the singular encompasses the expression of the plural unless the expression has a clearly different meaning in context. In the present specification, the terms such as "including," "having," and "comprising" are intended to indicate the presence of the features, numbers, steps, actions, elements, parts, or combinations thereof disclosed in the specification, and are not intended to preclude the possibility that one or more other features, numbers, steps, actions, elements, parts, or combinations thereof may be present or added.

In addition, it should be understood that although the terms "first," "second," etc. may be used herein to describe various elements, the elements are not limited by these terms. These terms are only used to distinguish one element from another. For example, a "first" element could be termed a "second" element, and, similarly, a "second" element could be termed a "first" element without departing from the scope of the present disclosure. As used herein, the term "and/or" includes any and all combinations of one or more of the associated listed items.

The terms "forward direction" and "front surface" used in the present specification refer to a direction and a surface based on a front surface of a display panel 10 configured to display an image in a display apparatus illustrated in FIG. 1. The terms "upper side" and "lower side" refer to an upper side and a lower side of the display apparatus 1 illustrated in FIG. 1, and the terms "both sides" and "lateral direction" refer to left and right directions of the display apparatus 1 illustrated in FIG. 1.

In addition, in the present specification, the display apparatus 1 will be described as being a wall-mounted display apparatus fixed to a wall surface W, as illustrated in FIG. 1, but the display apparatus 1 according to an exemplary embodiment is not limited thereto and may also be applied to a general stand-type display apparatus and the like.

Hereinafter, exemplary embodiments will be described in detail with reference to the accompanying drawings.

Figure 2:
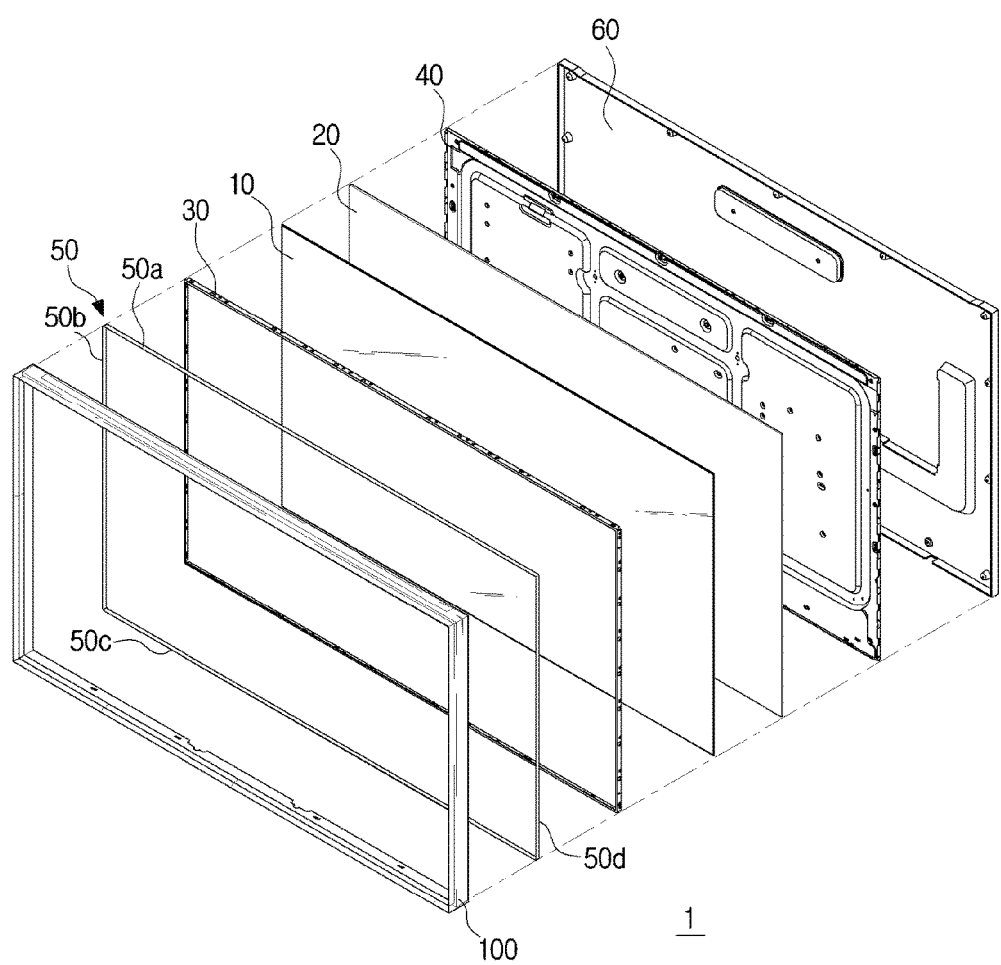
FIG. 2 is an exploded perspective view illustrating the display apparatus of FIG. 1.
Figure 3:
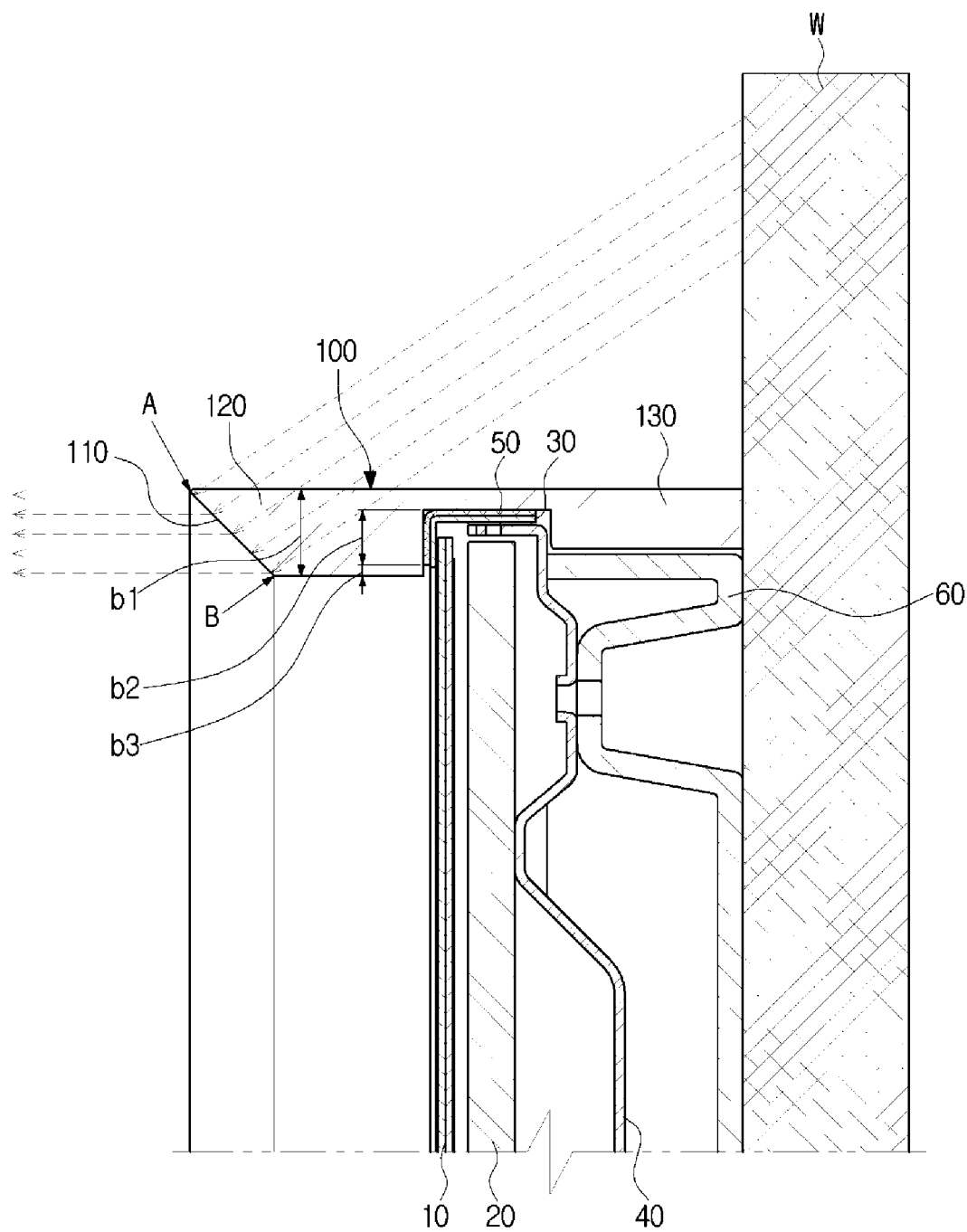
FIG. 3 is a cross-sectional side view illustrating a part of the display apparatus of FIG. 1.

As illustrated in FIGS. 1 to 3, a display apparatus 1 may include a display panel 10 configured to display an image. The display apparatus may also include a diffusion plate 20 disposed behind a back light unit (not shown) that is configured to emit light toward the display panel 10. The diffusion plate 20 may be disposed behind the display panel 10, and configured to diffuse and transmit light transmitted from a rear side thereof toward the display panel 10 located in front thereof. The display apparatus 1 may further include an optical sheet (not shown) interposed between the display panel 10 and the diffusion plate 20 and configured to improve optical characteristics of the light diffused by the diffusion plate 20. The display apparatus 1 may include a top chassis 30 coupled to a front side of the display panel 10, and a bottom chassis 40 coupled to a rear side of the top chassis 30 and configured to support the display panel 10. In addition, although not illustrated in the drawings, the display apparatus 1 may further include a middle mold interposed between and coupled to the top chassis 30 and the bottom chassis 40 and configured to support the display panel 10.

In addition, the display apparatus 1 may include a bezel 50 forming a front exterior of the display apparatus 1 and configured to cover an outer side of the top chassis 30, and a back cover 60 forming a rear exterior of the display apparatus 1 and configured to cover an outer side of the bottom chassis 40.

The display panel 10 may be provided as a liquid crystal panel in which a space between two glass substrates (not shown) including electrodes is filled with liquid crystals (not shown) and sealed. The optical sheet (not shown) may include a diffusion sheet configured to re-diffuse light transmitted through the diffusion plate 20, a prism sheet configured to focus the diffused light in a direction perpendicular to the display panel 10, a protective sheet configured to protect the prism sheet, and the like.

The top chassis 30 may be disposed in front of the display panel 10 and coupled to the bottom chassis 40 disposed behind the display panel 10. The display panel 10, the optical sheet (not shown), and the diffusion plate 20 may be interposed between the top chassis 30 and the bottom chassis 40 and supported in a space formed by coupling the top chassis 30 and the bottom chassis 40. Specifically, the display panel 10 and the like may be supported by the middle mold (not shown) provided between the top chassis 30 and the bottom chassis 40, and front and rear portions of the middle mold may be supported by the top chassis 30 and the bottom chassis 40.

The bezel 50 may form the front exterior of the display apparatus 1 and may be provided to cover side and front surfaces of the top chassis 30. In addition, a front surface of the bezel 50 may be provided to cover up to edge portions of a front surface of the display panel 10.

The bezel 50 according to an exemplary embodiment may be provided as a component separated from the top chassis 30, but the bezel 50 and the top chassis 30 may be integrally provided. That is, the bezel 50 may be provided to form the front exterior of the display apparatus 1 and also support the display panel 10 and the like with the bottom chassis 40, like the top chassis 30.

Accordingly, the bezel is not limited to the exemplary embodiment shown in FIGS. 1-3, and may also be integrally provided with the top chassis.

The back cover 60 may form the rear exterior of the display apparatus 1 and cover a rear surface of the bottom chassis 40. The back cover 60 according to an exemplary embodiment may be provided as a component separated from the bottom chassis 40, but may be integrally provided with the bottom chassis 40. That is, the back cover 60 may be provided to form the rear exterior of the display apparatus 1 and also support the display panel 10 and the like with the top chassis 30, like bottom chassis 40.

A light refraction member 100 including a transparent material may be provided on edges of the bezel 50. The light refraction member 100 will be described in detail below.

As illustrated in FIGS. 2 and 3, the light refraction member 100 may be provided in front of the bezel 50. Specifically, at least a part of the light refraction member 100 (a refraction surface 110 and an extension portion 120) may be disposed in front of the bezel 50, and the remaining part of the light refraction member 100 (a coupler portion 130) may be disposed at a location corresponding to the bezel 50 and/or behind the bezel 50. This will be described in detail below.

The bezel 50 may be provided in a frame shape having four sides corresponding to edges of four sides of the rectangular display panel 10. Accordingly, the bezel 50 may be provided in the frame shape having four length portions 50a, 50b, 50c, and 50d corresponding to the four sides of the display panel 10.

In some exemplary embodiments, the light refraction member 100 may be provided in front of at least three of the length portions (for example, the length portions 50a, 50b, and 50d) among the four length portions 50a, 50b, 50c, and 50d. In other exemplary embodiments, the light refraction member 100 may be alternatively provided in front of all four of the length portions 50a, 50b, 50c, and 50d. However, the light refraction member 100 is not limited thereto, and may be provided in front of at least a part of the bezel 50.

In the case of a conventional display apparatus, since the display apparatus is provided such that a bezel or top chassis including a bezel is provided to cover edges of a display panel, when a user watches the display apparatus, aesthetics of the display apparatus may be reduced due to the bezel.

Particularly, in the case of a wall-mounted display apparatus, when a color, a pattern or the like of a wall surface on which the display apparatus is mounted does not match a bezel, there is a problem in that aesthetics of the display apparatus are significantly reduced.

To prevent this, since the display apparatus 1 according to an exemplary embodiment is provided such that the light refraction member 100 is disposed in front of the bezel 50, the bezel 50 can be hidden from a user's sight.

In addition, the display panel 10 has an image display region in which an image is displayed and an image non-display region in which the image is not displayed and black is displayed beside edges of the image display region. The image non-display region is a region in which a black matrix region is formed along the edges of the image display region.

Generally, in the conventional display apparatus since a portion of the black matrix region is covered by the front surface of the bezel but an entire black matrix region is not covered by the bezel, the black matrix region may be shown and exposed from an inner side of the bezel in a black band shape which covers the edges of the image display region to the user, and thus aesthetics of the display apparatus may be reduced.

To prevent this, the light refraction member 100 according to an exemplary embodiment may be disposed in front of the black matrix region exposed to the user as well as the bezel 50 and may hide the bezel 50 and the black matrix region from the user's sight as described above.

As shown in FIG. 3, the light refraction member 100 may refract light (see dotted arrows in FIG. 3) reflected by the wall surface W, on which the display apparatus 1 is mounted, in a forward direction of the bezel 50, an image of the wall surface W may be formed in front of the bezel 50, and thus a shape of the bezel 50 may be hidden from the user's sight.

In addition, the light refraction member 100 may refract the light reflected by the wall surface W in the forward direction of the black matrix region as well as the bezel 50 to hide the bezel 50 and the black matrix region from the user's sight.

That is, the light refraction member 100 may refract light reflected from an outer rear side of the bezel 50 in the forward direction of the bezel 50.

Figure 4:
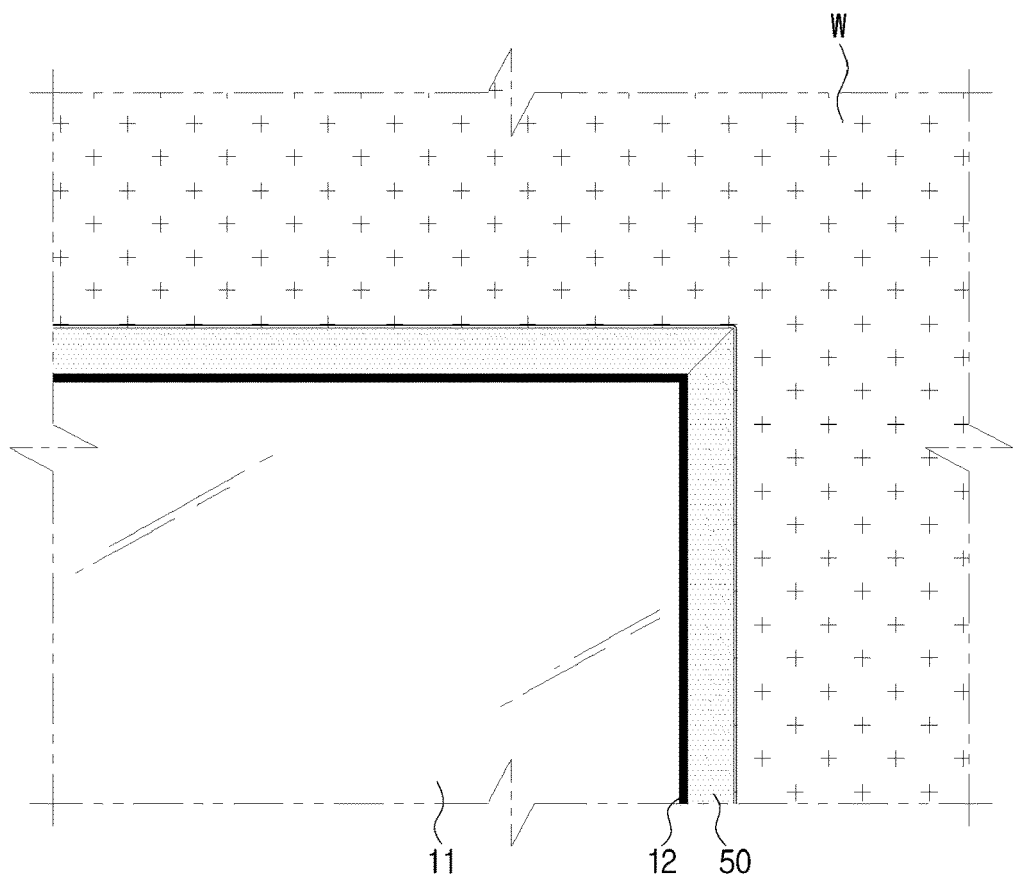
FIG. 4 is a front view illustrating a part of a display apparatus when a light refraction member is removed from the display apparatus according to an exemplary embodiment.

As illustrated in FIG. 4, when there is no light refraction member 100, a non-display region 12 including a black matrix region formed beside the edges of a display region 11 of the display panel 10, and a shape of the bezel 50 provided at edges of the non-display region 12 may be exposed forward.

Figure 5:
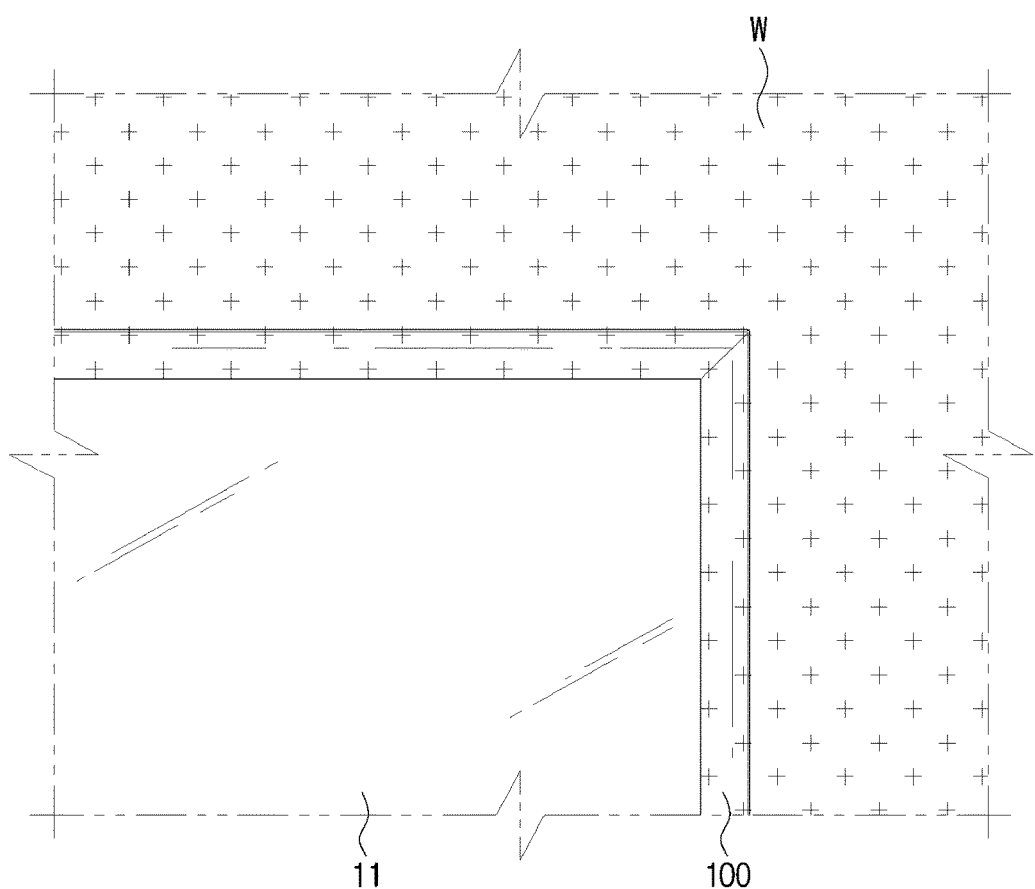
FIG. 5 is a front view illustrating a part of the display apparatus according to an exemplary embodiment.

However, as illustrated in FIG. 5, in a case in which the light refraction member 100 is disposed in front of the bezel 50 and the non-display region 12, since the wall surface W is visible from the front of the non-display region 12 and the bezel 50 due to the light refraction member 100, the non-display region 12 and the bezel 50 is not visible to the user from the edges of the display region 11, and the wall surface W may be directly visible at the outside of the display region 11.

Returning to FIG. 3, in the light refraction member 100, the refraction surface 110 disposed in front of the bezel 50 may be disposed in the forward direction to be inclined with respect to the display panel 10. Light obliquely reflected in the forward direction of the bezel 50 from the outer rear side of the bezel 50 by the wall surface W may be perpendicularly refracted in the forward direction of the display panel 10 while passing through the refraction surface 110, and may enter the user's field of vision.

Accordingly, an image shown to the user from the bezel 50 is a shape of the wall surface W instead of a shape of the bezel 50 or the non-display region 12 such that the user cannot recognize the bezel 50 or the non-display region 12. Accordingly, the user can feel that the display apparatus 1 and the wall surface W are integrally formed.

Specifically, as illustrated in FIG. 3, the refraction surface 110 may be provided to be inclined in the forward direction from an inner side of the bezel 50 (a side of the bezel 50 adjacent to the display panel 10) toward an outer side of the bezel 50 (an edge of bezel 50 adjacent to the outer side of the bezel 50).

In other words, the refraction surface 110 may be provided in the forward direction to be outwardly inclined from a center of the display apparatus 1 with respect to the wall surface W on which the display apparatus 1 is mounted.

One front end A of the refraction surface 110 may be provided to be disposed at an outer side of the bezel 50. This is for refracting light, which is reflected by the wall surface W and incident from the outer rear side of the bezel 50, in the forward direction to hide the entire front surface of the bezel 50. In a case in which one front end A of refraction surface 110 is disposed at a location closer to the display panel 10 than to an outer side of the bezel 50, the outer side of the bezel 50 may be exposed to the user. In addition, when one front end A of the refraction surface 110 is disposed further outward than the outer side of the bezel 50, there may be an effect in that too much light reflected by the wall surface W may be perpendicularly refracted in the forward direction.

The other rear end B of the refraction surface 110 may be disposed to correspond to at least an inner end of the bezel 50. Accordingly, the entire front surface of the bezel 50 may be hidden. However, when the other rear end B of the refraction surface 110 is located further inward than the inner end of the bezel 50, the non-display region 12 of the display panel 10 as well as the bezel 50 may be hidden.

In other words, since the other rear end B of the refraction surface 110 is disposed at a region corresponding to the non-display region 12, light reflected by the wall surface W may be refracted in the forward direction of the bezel 50 and the non-display region 12.

A width b1 of the light refraction member 100 shown in the forward direction of the display apparatus 1 may be provided to be greater than a width b2 of the bezel 50. Particularly, a location of one front end A of the refraction surface 110 may be provided to be disposed further outward than the outside edge of the bezel 50 (such that the width b1 is greater than the width b2 of the bezel 50), and a location of the other rear end B of the refraction surface 110 may be provided to be disposed further inward than the inside edge of the bezel 50 (such that the width b1 is greater than the width b2 of the bezel 50). The location of the other rear end B of the refraction surface 110 may be disposed further inward than the inside edge of the bezel 50 by a width b3 of the non-display region 12 in an inward direction.

The extension portion 120 may be provided behind the refraction surface 110. The extension portion 120 may be provided in front of the bezel 50 and interposed between the refraction surface 110 and the front surface of the bezel 50.

The extension portion 120 may be provided such that light reflected by the wall surface W located at the outer rear side of the bezel 50 is incident on the refraction surface 110. That is, in a case in which the extension portion 120 is not provided, the refraction surface 110 may be disposed to be adjacent to the front surface of the bezel 50, and in this case, the light reflected by the wall surface W may not be incident on the refraction surface 110 due to the outer side of the bezel 50.

To prevent this, the extension portion 120 may be provided to extend in the forward direction of the bezel 50 such that the light reflected by the wall surface W may be sufficiently incident on the refraction surface 110.

The refraction surface 110 and the extension portion 120 may be formed of a transparent material such that light is transmitted therethrough. Light incident on the extension portion 120 is transmitted to the extension portion 120 and the refraction surface 110 due to the transparent material, and the light transmitted to the refraction surface 110 may be refracted in the forward direction of the display apparatus.

An inclination angle of the refraction surface 110 and a length of the extension portion 120 extending in the forward direction may vary according to the width b2 of the bezel 50 and a front-to-rear length of the display apparatus 1.

Hereinafter, a structure in which the light refraction member 100 according to an exemplary embodiment is coupled to the display apparatus 1 will be described in detail.

Figure 6:
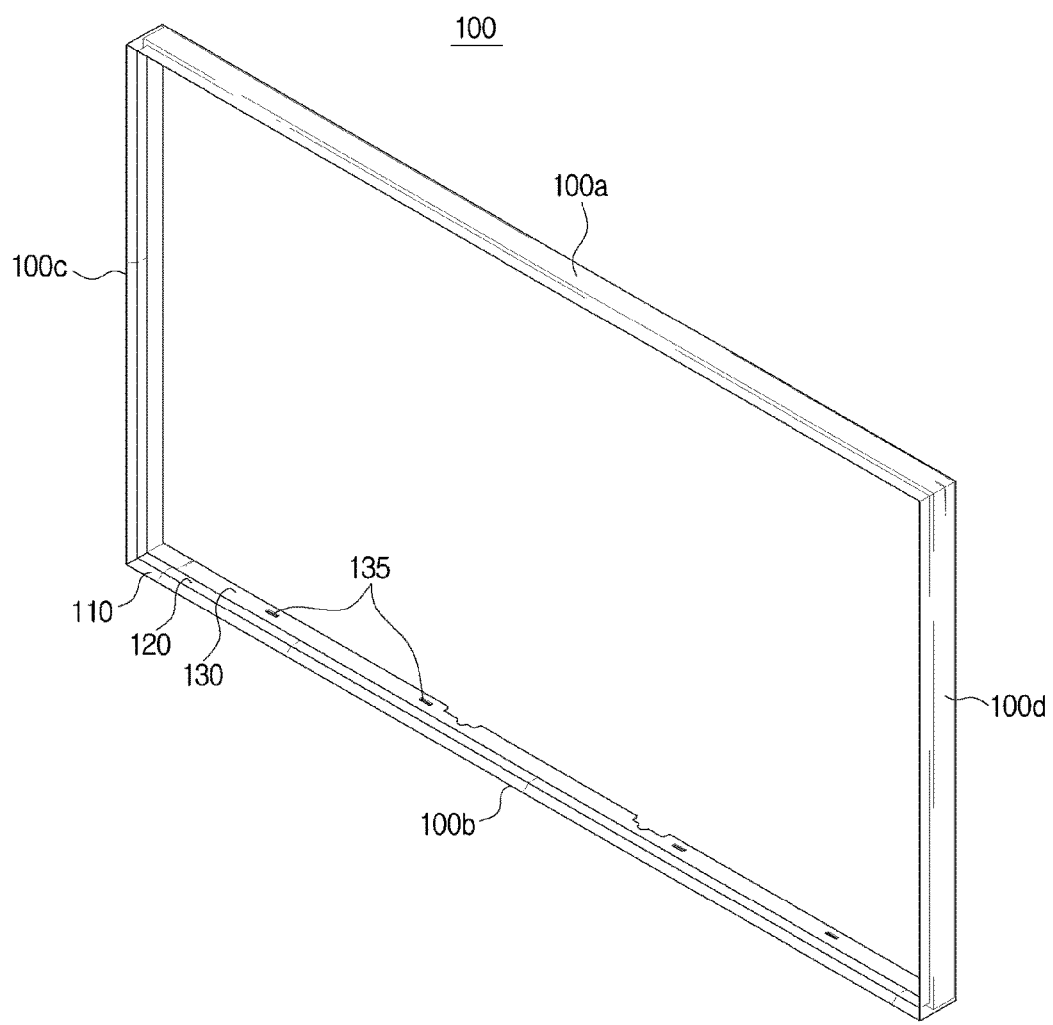
FIG. 6 is a perspective view illustrating a light refraction member of the display apparatus according to an exemplary embodiment.

As illustrated in FIG. 6, the light refraction member 100 may be provided in a frame shape having four sides. That is, the light refraction member 100 may include an upper frame 100a, a lower frame 100b, a left frame 100c, and a right frame 100d corresponding to the length portions 50a, 50b, 50c, and 50d of the bezel 50.

Since light passes through an inner portion of the extension portion 120 and the refraction surface 110 in the forward direction of the light refraction member 100, it is advantageous for the light refraction member 100 to be integrally formed. This is because, in the case in which the light refraction member 100 is provided with two or more components, and the two or more of the components are assembled into one light refraction member 100, a component (such as, for example, an adhesive) which assists in the assembly of the light refraction member 100 is disposed in the extension portion 120 such that a moving path of light is restricted.

Accordingly, integrally forming the frames 100a, 100b, 100c, and 100d is more advantageous to coupling the separate frames 100a, 100b, 100c, and 100d to each other.

However, the light refraction member 100 is not limited to the exemplary embodiment shown in FIG. 6, and the light refraction member 100 may, in some exemplary embodiments, be provided with a plurality of components and assembled. Here, a component which assists in the assembly may be disposed not to restrict a light path inside the extension portion 120.

Accordingly, since the light refraction member 100 is integrally formed, there may be a disadvantage in that it is more difficult to couple the light refraction member 100 to the display apparatus 1.

Figure 7:
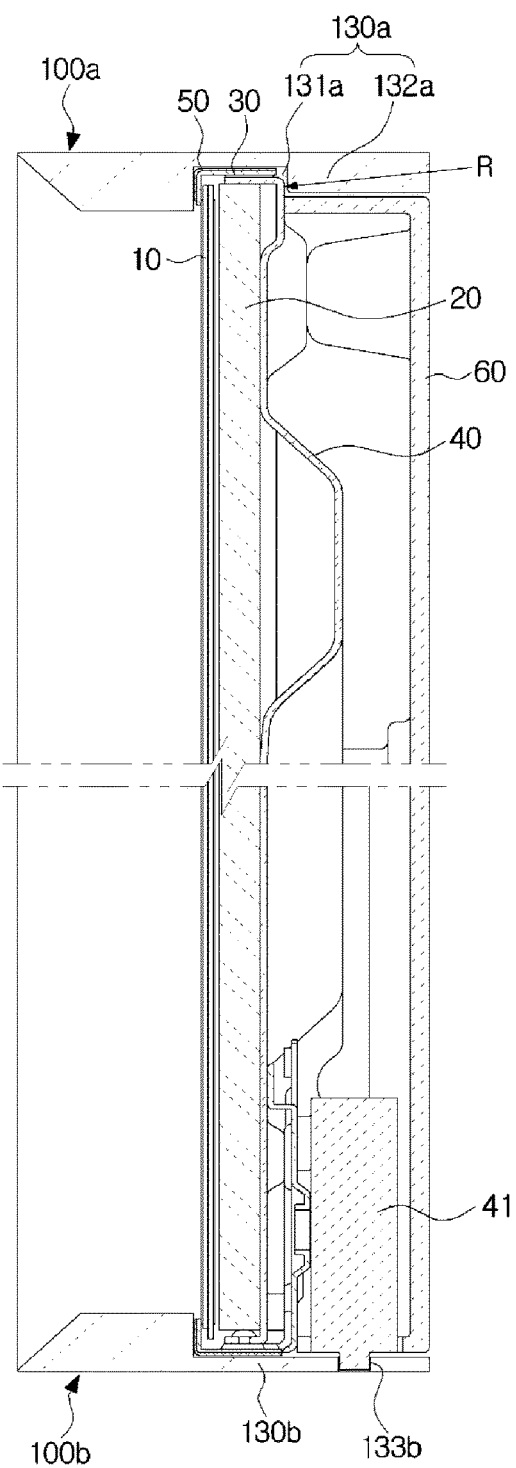
FIG. 7 is a cross-sectional view taken along line AA' of FIG. 1.
Figure 8:
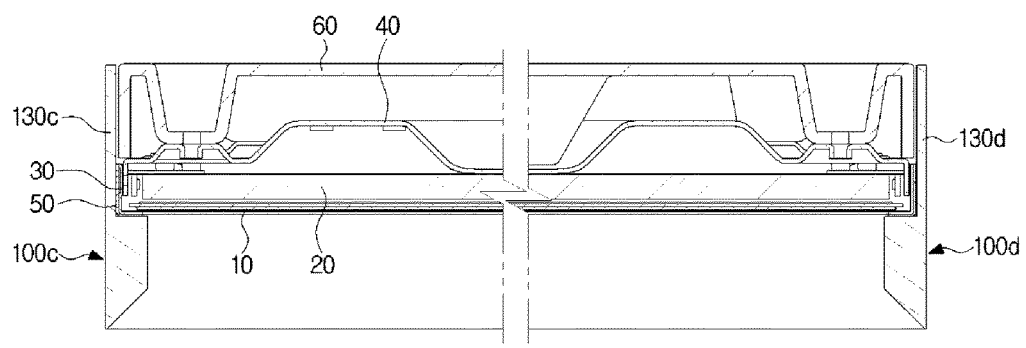
FIG. 8 is a cross-sectional view taken along line BB' of FIG. 1.
Figure 9:
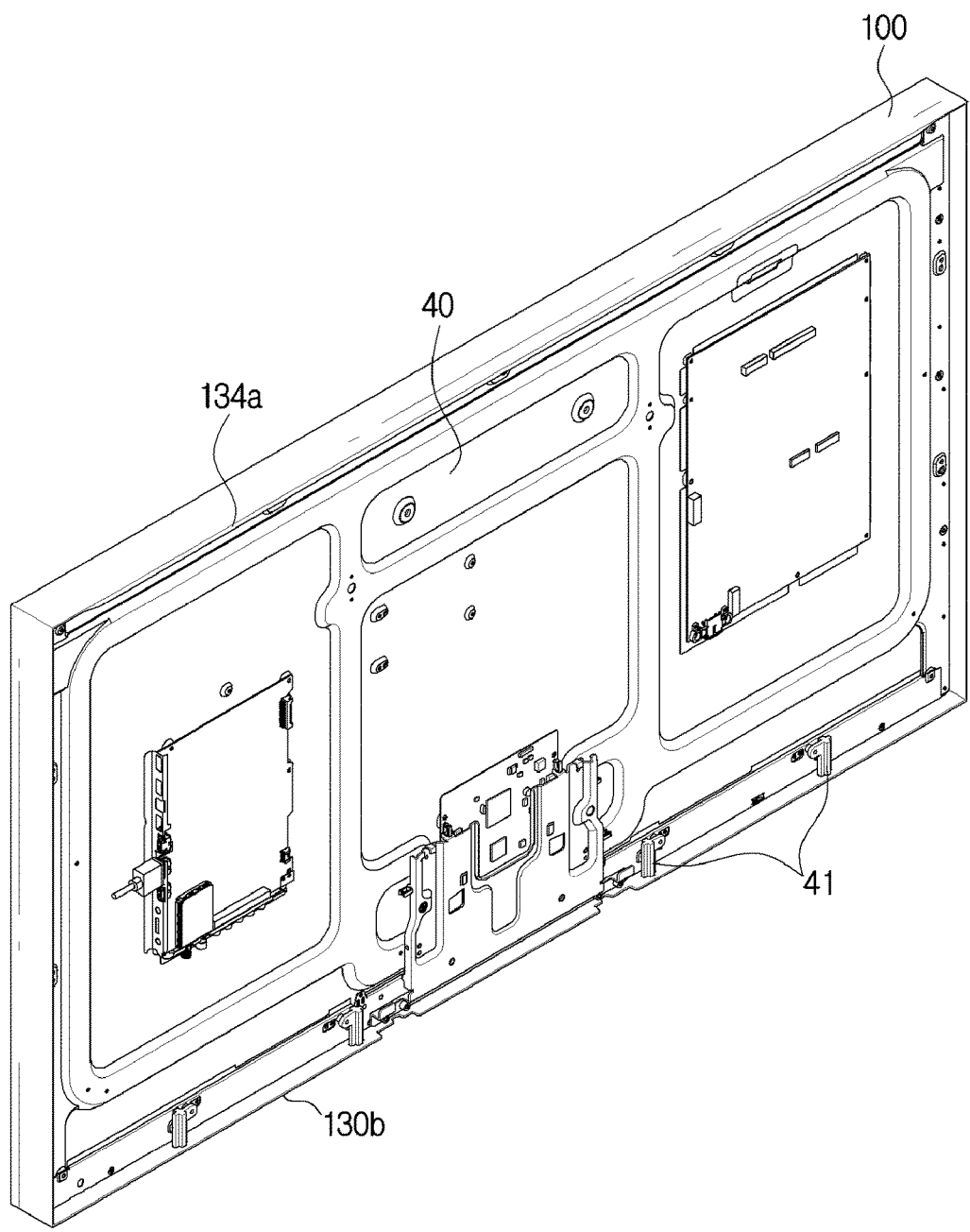
FIG. 9 is a perspective view illustrating a rear surface of the display apparatus according to an exemplary embodiment in a state in which a back cover is removed from the display apparatus.

As illustrated in FIGS. 7 to 9, at least one frame 100a among the four frames 100a, 100b, 100c, and 100d may be hook-coupled to the bezel 50. Specifically, the coupler portion 130 coupled to the bezel 50 is provided behind the extension portion 120, and the coupler portion 130 may be hook-coupled to the bezel 50.

An upper coupler portion 130a of the coupler portion 130 disposed on the upper frame 100a may be provided with an upper coupling groove 131a into which a side portion of the bezel 50 is inserted and an upper support 132a configured to support the bezel 50 when at least a part of the bezel 50 is inserted into the upper coupling groove 131a.

Accordingly, when the display apparatus 1 except the light refraction member 100 (or except the light refraction member 100 and the back cover 60) is pressed in the forward direction from a rear side of the light refraction member 100, the display apparatus 1 passes through an opening formed between the four frames 100a, 100b, 100c, and 100d of the light refraction member 100, and then the bezel 50, which forms a side surface of the display apparatus 1, comes into contact with the coupler portion 130. In this way, the edge of the bezel 50 may be snapped into the upper coupling groove 131a and held in place.

Here, the bezel 50 may be inserted into the upper coupling groove 131a recessively provided in the upper coupler portion 130a and supported by the upper support 132a. That is, since the upper support 132a is hook-coupled to the bezel 50, the light refraction member 100 may be fixed to the bezel 50.

However, the bezel 50 is not limited to the exemplary embodiment shown in FIG. 7, and the bezel 50 may not be hook-coupled to the upper coupler portion 130a, but may be simply inserted into the upper coupling groove 131a, and an insertion state of the bezel 50 may be maintained by the other frames 100b, 100c, and 100d such that the light refraction member 100 may be coupled to the bezel 50.

A lower portion of the bezel 50 may be provided to be in contact with a lower coupler portion 130b disposed on the lower frame 100b. The lower coupler portion 130b may support coupling of the upper coupler portion 130a and the bezel 50 from below to prevent escape of the light refraction member 100 from the bezel 50.

A height of an upper end of the back cover 60 may be provided to be lower than the bezel 50. In other words, the upper end of the back cover 60 may be disposed below the upper coupler portion 130a. The upper support 132a may be disposed behind the bezel 50 to hook-couple the upper coupler portion 130a to the bezel 50, and thus, a maximum height of the upper end of the back cover 60 is a height at which the upper end of the back cover 60 faces a lower end of the upper support 132a.

Accordingly, as shown in FIG. 7, the back cover 60 may not completely cover a rear upper surface R of the bottom chassis 40, and the rear upper surface R of the bottom chassis 40 may be covered by the light refraction member 100 so as not to be exposed to the outside.

A hook 134a on which the upper end of the back cover 60 is hooked when the upper coupler portion 130a and the bezel 50 are coupled may be provided at a rear end of the upper coupler portion 130a (see FIG. 9).

The hook 134a may be provided to protrude downward from the rear end of the upper coupler portion 130a and additionally to prevent the escape of the light refraction member 100 from the bezel 50 in a state in which the coupler portion 130 and the bezel 50 are coupled.

Coupling members 41 may be additionally coupled to insertion grooves 133b provided in the coupler portion 130 to prevent the escape of the light refraction member 100 from the bezel 50 in the state in which the bezel 50 and the coupler portion 130 are coupled.

Specifically, the coupling protrusions 41 protruding downward may be provided at a rear lower surface of the bottom chassis 40, and the insertion grooves 133b formed in the lower coupler portion 130b may be provided at a location corresponding to the coupling protrusions 41 such that the coupling protrusions 41 are inserted into the lower coupler portion 130b.

In a case in which the display apparatus 1 is coupled to the light refraction member 100 in a state in which the back cover 60 is not assembled thereto, the lower portion of the bezel 50 may be supported by the lower coupler portion 130b, each of the coupling protrusions 41 may be inserted into one of insertion grooves 133b, and thus the coupling protrusions 41 may be coupled to the rear lower surface of the bottom chassis 40 to more firmly support the light refraction member 100.

As shown in FIG. 8, a left coupler portion 130c and a right coupler portion 130d are provided to be in contact with a left bezel 50 and a right bezel 50, respectively, to support the light refraction member 100 perpendicularly coupled with respect thereto.

Unlike the upper end of the back cover 60, a left end, a right end, and a lower end of the back cover 60 may extend up to a location corresponding to the outer side of the bezel 50. This is because the upper support 132a extending backward is not disposed at the lower coupler portion 130b, the left coupler portion 130c, and the right coupler portion 130d.

Figure 10:
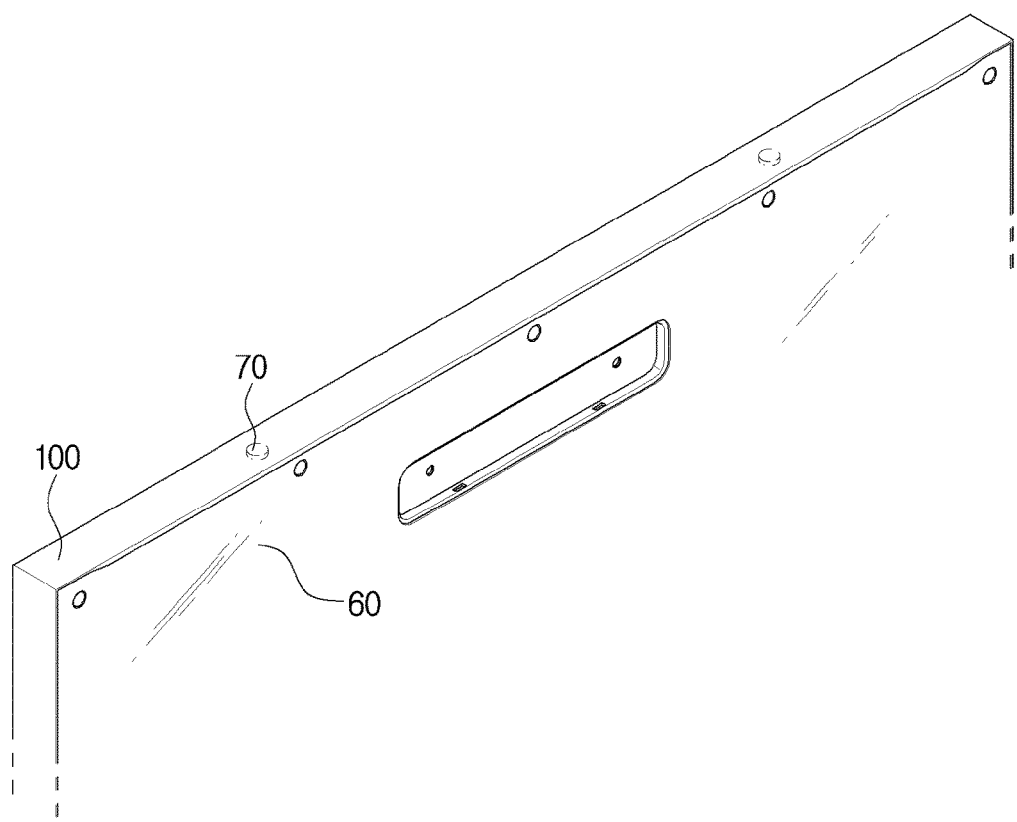
FIG. 10 is a perspective view illustrating a part of an upper portion of the display apparatus according to an exemplary embodiment.

As illustrated in FIG. 10, illumination sensors 70 may be disposed at an upper portion of the display apparatus. Specifically, the illumination sensors 70 may be interposed between the light refraction member 100 and the bezel 50.

Since the light refraction member 100 is formed of the transparent material as described above, external light may be transmitted to and incident on the illumination sensor 70 even when the illumination sensor 70 is disposed further outward than the light refraction member 100.

The illumination sensor 70 may collect brightness information of a space in which the display apparatus 1 is installed to control brightness of an image displayed by display panel 10.

Although not illustrated in the drawings, the light refraction member 100 according to an exemplary embodiment may include a plurality of heat dissipation holes to dissipate heat generated by the display apparatus 1. The heat dissipation holes may be provided such that movement of light passing through an inside of the light refraction member 100 is not interfered with.

In addition, the light refraction member 100 according to an exemplary embodiment may be provided with an infrared (IR) hole such that IR light of a remote controller configured to remotely control the display apparatus 1 reaches an inside of the display apparatus 1. The IR hole may also be provided such that light passing through the inside of the light refraction member 100 is not interfered with, like the above described heat dissipation holes.

Hereinafter, a display apparatus 1 according to another exemplary embodiment will be described with reference to FIGS. 11-12. Components other than a reflection member 80, which will be described below, are the same as those of the above-described display apparatus 1, and thus repeated descriptions thereof will be omitted.

The reflection member 80 including a material which may reflect light may be provided on a front surface of a bezel 50. The reflection member 80 may be attached to the front surface of the bezel 50 or provided to be supported between the bezel 50 and a light refraction member 100.

Figure 12:
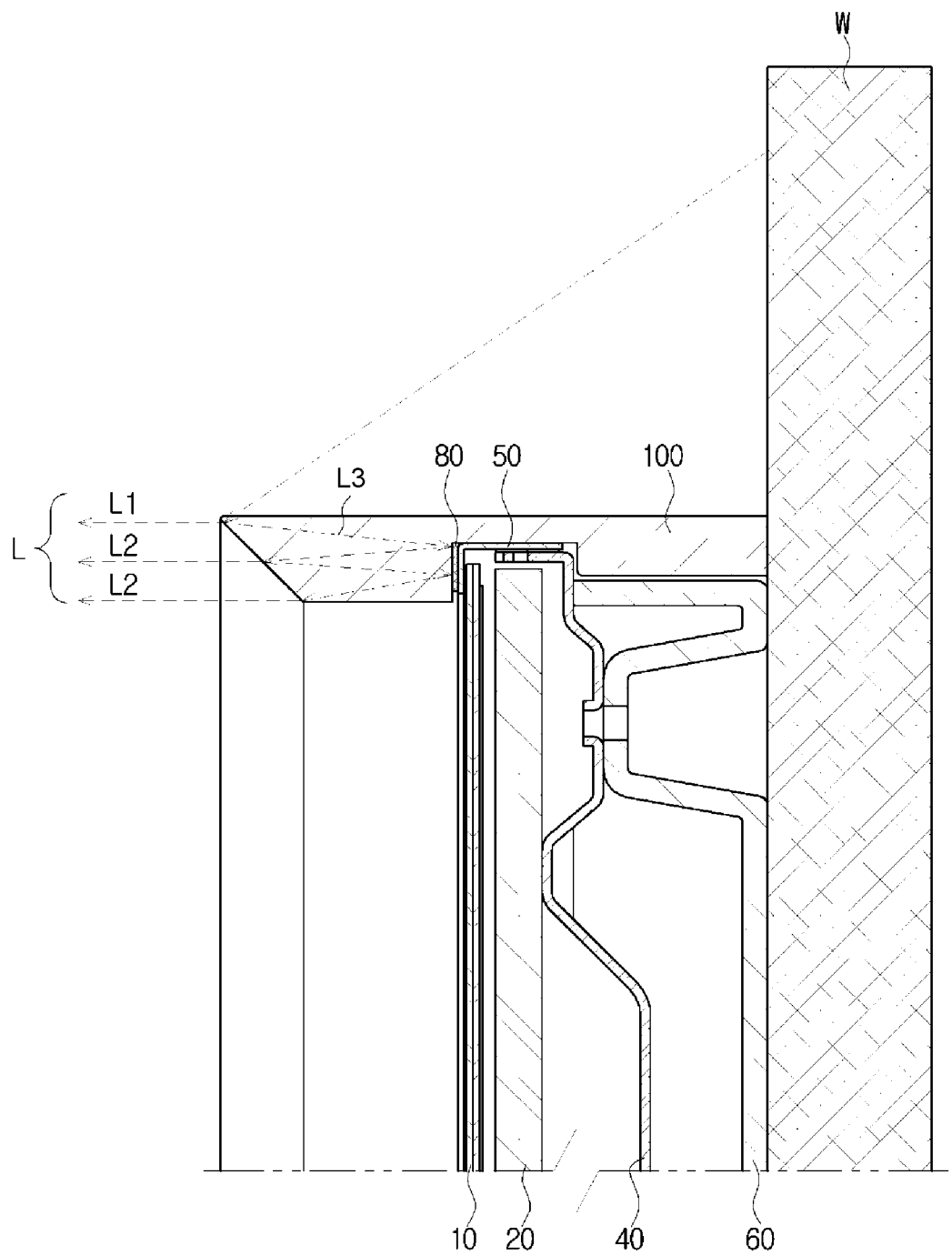
FIG. 12 is a cross-sectional side view illustrating a part of the display apparatus according to another exemplary embodiment.

As shown in FIG. 12, the reflection member 80 may be provided to reflect light L2 in a forward direction, and the light L3 is refracted by a refraction surface 110 in a backward direction rather than in the forward direction thereof such that a sufficient amount of light is emitted in the forward direction of a display panel 10, wherein the light L includes the light L2 and light L1 refracted by the refraction surface 110 in the forward direction.

Figure 11:
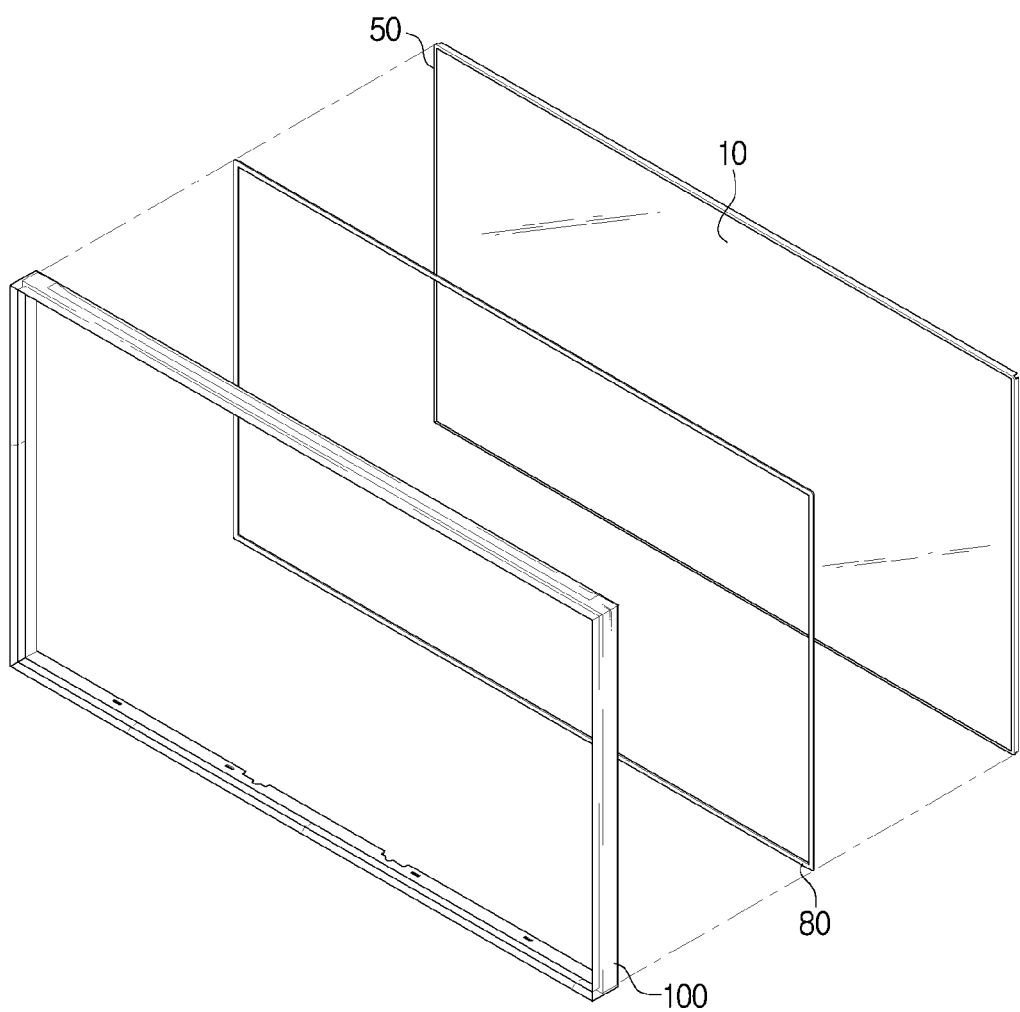
FIG. 11 is an exploded perspective view illustrating some components of a display apparatus according to another exemplary embodiment.

The reflection member 80 may not be limited to the exemplary embodiment shown in FIGS. 11-12, and may also be attached to a side surface of the bezel 50 in addition to the front surface thereof. Accordingly, the reflection member 80 may reflect some light in the forward direction to increase an amount of light reflected in the forward direction, wherein the some light passes through an extension portion 120, is not emitted in the forward direction, and is emitted in a different direction.

Hereinafter, a display apparatus 1 according to another exemplary embodiment will be described with reference to FIGS. 13-14. Components other than a lower coupler portion 130b, which will be described below, are the same as those of the above described display apparatus 1, and thus repeated descriptions thereof will be omitted.

Figure 13:
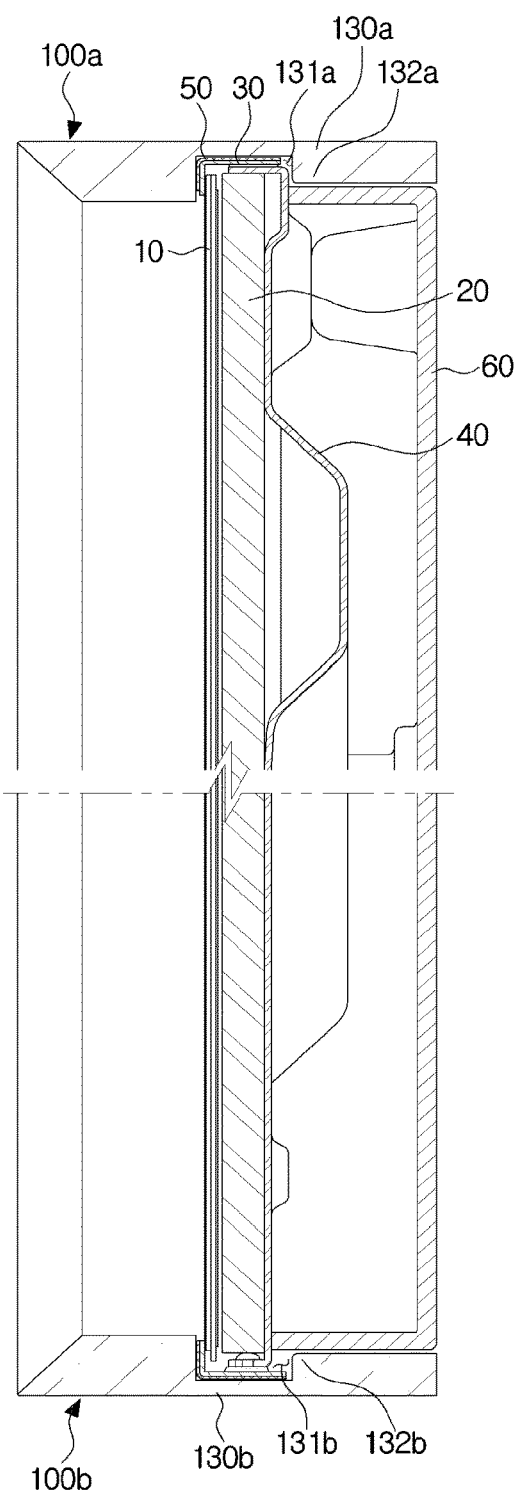
FIG. 13 is a cross-sectional side view illustrating a display apparatus according to still another exemplary embodiment.
Figure 14:
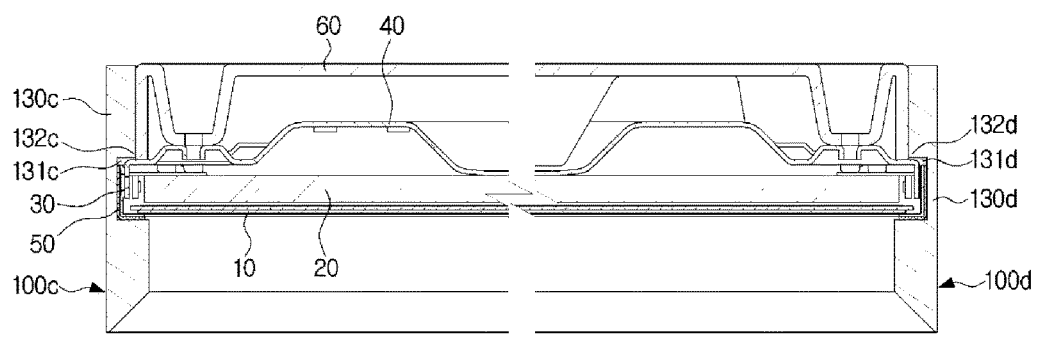
FIG. 14 is a cross-sectional side view illustrating a display apparatus according to yet another exemplary embodiment.

As illustrated in FIG. 13, the coupler portion 130b of a lower frame 100b may be provided with a lower coupling groove 131b and a lower support 132b, similar to an upper coupler portion 130a.

The lower coupler portion 130b may be hook-coupled to a bezel 50, similar to the upper coupler portion 130a. Since the display apparatus 1 except a light refraction member 100 is pressed in the forward direction from behind, the light refraction member 100, the upper coupler portion 130a and the lower coupler portion 130b may respectively come into contact with and be hook-coupled to upper and lower sides of the bezel 50.

Accordingly, in the exemplary embodiment shown in FIG. 13, the light refraction member 100 may be hook-coupled to upper and lower ends of the bezel 50. Accordingly, coupling protrusions 41 may be omitted in the lower coupler portion 130b. Accordingly, the number of components may decrease and a manufacturing process may be simplified.

However, the bezel 50 is not limited to the exemplary embodiment shown in FIG. 13, and the coupling protrusions 41 may be disposed on a left side or a right side, or both of the left and right sides of the bottom chassis 40, and may be inserted into a left coupler portion 130c of a left frame or right coupler 140c of a right frame, or into both the left coupler portion 130c and the right coupler portion 130d of the right frame 140. Accordingly, the light refraction member 100 may be further stably coupled to the bezel 50.

Hereinafter, a display apparatus 1 according to another exemplary embodiment will be described with reference to FIG. 14. Components other than a left coupler portion 130c and a right coupler portion 130d, which will be described below, are the same as those of the above described display apparatus 1, and thus repeated descriptions thereof will be omitted.

Unlike the above-described exemplary embodiments, the left coupler portion 130c and the right coupler portion 130d may include a left coupling groove 131c into which a left portion of a bezel 50 is inserted and a right coupling groove 131d into which right portion of the bezel 50 is inserted.

In addition, the left coupler portion 130c and the right coupler portion 130d may respectively include a left support 132c into which the left portion of the bezel 50 is inserted and supported and a support 132d into which the right portion of the bezel 50 is inserted and supported.

Accordingly, when a light refraction member 100 is coupled to the bezel 50, a left frame 100c and a right frame 100d may be hook-coupled to the bezel 50 as well as an upper frame 100a. Accordingly, at least three frames 100a, 100c, and 100d of the light refraction member 100 may be hook-coupled to three length portions 50a, 50c, and 50d of the bezel 50.

In addition, in a case in which the display apparatus 1 is provided such that a lower coupler portion 130b of the light refraction member 100 is hook-coupled to the bezel 50, as illustrated in FIG. 13, all four frames 100a, 100b, 100c, and 100d of the light refraction member 100 may be hook-coupled to the bezel 50 in some exemplary embodiments.

Hereinafter, a display apparatus 1 according to another exemplary embodiment will be described with reference to FIG. 15. Components other than a light refraction member 100', which will be described below, are the same as those of the above described display apparatus 1, and thus repeated descriptions thereof will be omitted.

Unlike the above-described exemplary embodiments, the light refraction member 100' may be attached to a front surface or to a side surface, or to both the front and side surfaces of a bezel 50 and coupled to the bezel 50. That is, an adhesive member and the like may be provided on the front surface or on the side surface of the bezel 50, or on both the front and side surfaces of the bezel 50 to attach the light refraction member 100' to the bezel 50. It should be noted that an adhesive may be applied in this manner to the display apparatus 1 according to any of the above-described exemplary embodiments.

Accordingly, the light refraction member 100' can be easily attached to and supported by the bezel 50.

Since the light refraction member 100' is disposed on the front surface or the side surface of the bezel 50, or on both the front and side surfaces of the bezel 50, the light refraction member 100' does not extend up to a rear side of the bezel. Accordingly, a back cover 60' may be provided to extend up to a rear side of the light refraction member 100'.

Figure 15:
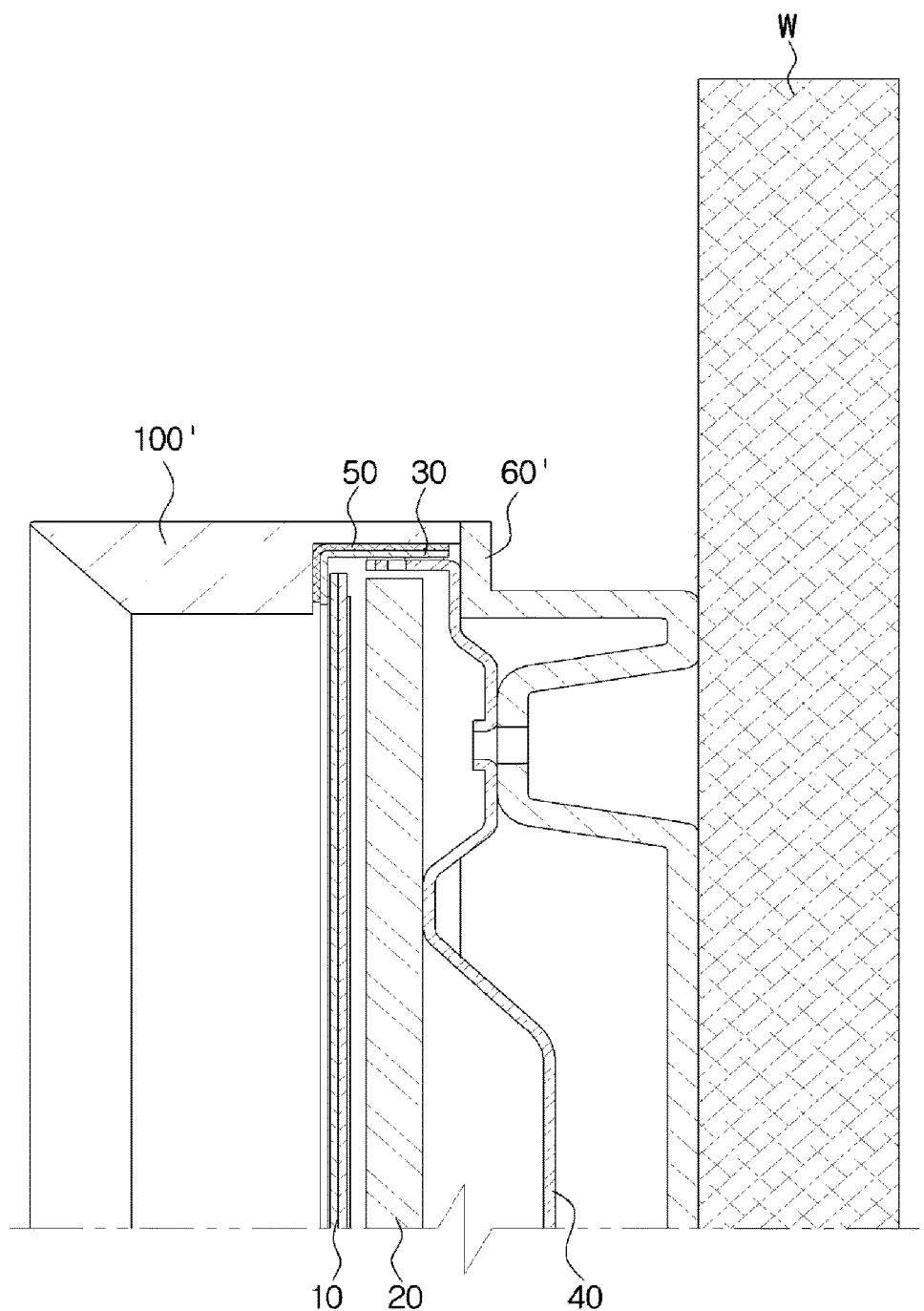
FIG. 15 is a cross-sectional side view illustrating a display apparatus according to yet another exemplary embodiment.

All four frames of the light refraction member 100' may be formed as illustrated in FIG. 15, but are not limited thereto, and at least one among the four frames of the light refraction member 100' may include a coupler portion 130 to be hook-coupled to the bezel 50 and a part of the light refraction member 100'.

Hereinafter, a display apparatus 1 according to another exemplary embodiment will be described with reference to FIGS. 16-17. Components other than a refraction surface 110, which will be described below, are the same as those of the above described display apparatus 1, and thus repeated descriptions will be omitted.

Figure 16:
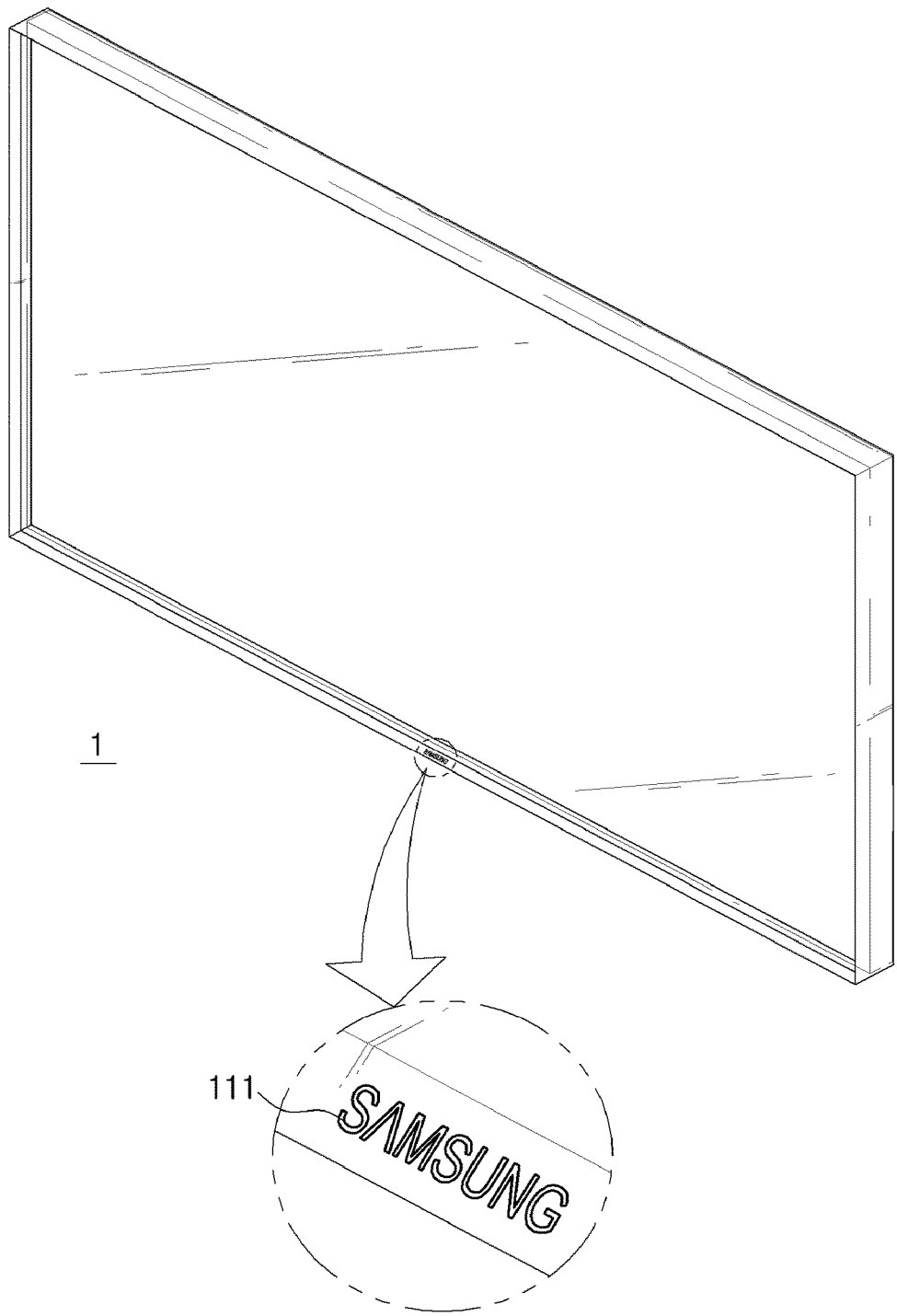
FIG. 16 is a perspective view illustrating a display apparatus according to yet another exemplary embodiment.
Figure 17:
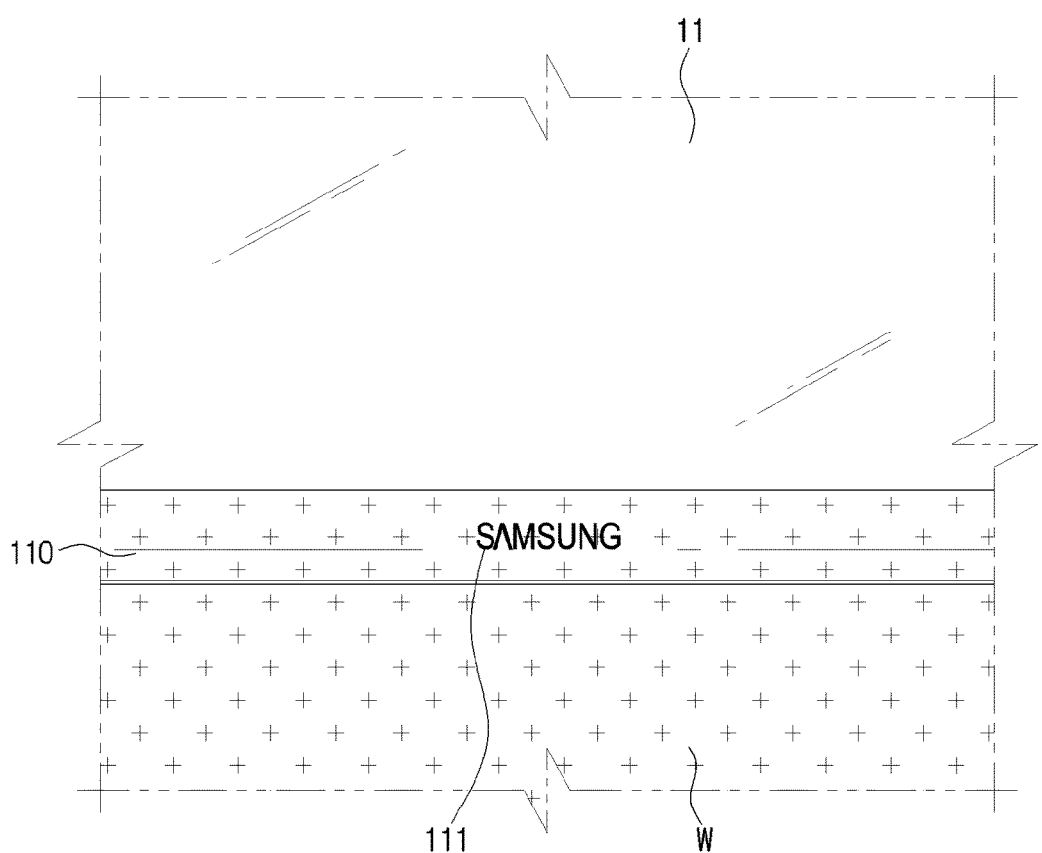
FIG. 17 is a front view illustrating a part of the display apparatus according to yet another exemplary embodiment.

As illustrated in FIGS. 16 and 17, a pattern or letter shape 111 may be provided on a refraction surface 110. The pattern or letter shape 111 may be formed on the refraction surface 110 by printing, carving, or the like on the refraction surface 110.

Accordingly, a user may recognize the pattern or letter shape 111 as if the pattern or letter shape were floating on a wall surface W. Accordingly, overall aesthetics of the display apparatus 1 may be improved.

The pattern or letter shape 111 is not be limited to that shown in FIGS. 16 and 17 and may be provided in a continuous shape of continuous patterns, and light may be emitted toward the pattern or letter shape 111 to achieve an improved effect.

As is apparent from the above description, in the display apparatus according to exemplary embodiments of the present disclosure, aesthetics of an exterior of the display apparatus can be effectively improved by refracting light through a member to hide a bezel.

The present disclosure is not limited to the above-described exemplary embodiments, and it should be clear to those skilled in the art that various modifications and changes may be made without departing from the scope of the present disclosure. Therefore, modified or changed exemplary embodiments are included in the range of the claims of the present disclosure.

What is claimed is:

1. A display apparatus comprising:
   a display panel configured to display an image in a forward direction thereof;
   a bezel disposed on an edge of the display panel;
   a light refraction member disposed in front of the bezel, the light refraction member including a transparent material, and configured to refract light of an outer rear side of the bezel in a forward direction of the bezel; and
   a reflection member provided between a front side of the bezel and the light refraction member.

2. The display apparatus of claim 1, wherein:
   the light refraction member includes a refraction surface disposed to be inclined in the forward direction from an inside of the bezel to an outside thereof; and
   the refraction surface refracts the light of the outer rear side of the bezel in the forward direction of the bezel.

3. The display apparatus of claim 2, wherein:
   a front end of the refraction surface is disposed further outward than the bezel; and
   a rear end of the refraction surface is disposed on a region of the edge of the display panel.

4. The display apparatus of claim 2, wherein the light refraction member further includes a coupler portion configured to extend to a rear side of the refraction surface and to be coupled to the bezel.

5. The display apparatus of claim 4, wherein the coupler portion includes an insertion groove into which at least a part of the bezel is inserted.

6. The display apparatus of claim 4, wherein the coupler portion is hook-coupled to the at least a portion of the bezel.

7. The display apparatus of claim 4, wherein the light refraction member includes an extension portion configured to connect the refraction surface and the coupler portion, the extension portion extending in the forward direction of the display panel.

8. The display apparatus of claim 1, wherein a first width of the light refraction member is greater than a second width of the bezel.

9. The display apparatus of claim 1, wherein:
   the bezel includes four length portions configured to extend along four sides of the display panel, respectively, and
   the light refraction member is provided in front of at least three length portions among the four length portions.

10. The display apparatus of claim 9, wherein the light refraction member is provided in front of the four length portions.

11. The display apparatus of claim 1, further comprising an illumination sensor interposed between the bezel and the light refraction member.

12. The display apparatus of claim 2, wherein a pattern or letter shape is provided on the refraction surface.

13. A display apparatus mounted on a wall surface, the display apparatus comprising:
   a display panel configured to display an image in a forward direction thereof;
   a bezel disposed on an edge of the display panel;
   a light refraction member disposed in front of the bezel and including a transparent material; and
   a reflection member provided between a front side of the bezel and the light refraction member,
   wherein the light refraction member refracts light reflected by the wall surface adjacent to the bezel in a forward direction of the bezel in order to hide a shape of the bezel.

14. The display apparatus of claim 13, wherein the display panel include an image non-display region along edges of the display panel, and
   the light refraction member refracts the light reflected by the wall surface in a forward direction of the bezel and in a forward direction of the image non-display region in order to hide a first shape of the bezel and a second shape of the image non-display region.

15. The display apparatus of claim 14, wherein the light refraction member has a first end and a second end in a width direction,
   the first end of the light refraction member is disposed further outward than the bezel; and
   the second end of the light refraction member is provided to correspond to the image non-display region.

16. The display apparatus of claim 13, wherein:
   the light refraction member includes a refraction surface provided to be inclined in the forward direction from an inside of the bezel to an outside of the bezel; and
   the refraction surface refracts light of the wall surface adjacent to the bezel in the forward direction of the bezel.

17. The display apparatus of claim 16, wherein the light refraction member includes a coupler portion provided to extend to a rear side of the refraction surface and configured to be in contact with the bezel.

18. The display apparatus of claim 17, further comprising a bottom chassis disposed behind the display panel, wherein:
   the bottom chassis includes a coupling protrusion configured to protrude toward the coupler portion to be coupled to the coupler portion; and
   the coupler portion includes an insertion groove into which the coupling protrusion is inserted when the coupler portion is coupled to the bezel.

19. A display apparatus comprising:
   a display panel including a display region, in which an image is displayed in a forward direction thereof and a non-display region formed along edges of the display region, and having a rectangular shape;
   a bezel disposed on an edge of the display panel;
   a light refraction member disposed in front of the bezel and the non-display region and including a refraction surface disposed to be inclined in the forward direction from an inside edge of the bezel to an outer edge of the bezel, wherein the refraction surface includes a transparent material, reflects light of an outer rear side of the edge of the bezel toward an inside of the outer edge of the bezel, in order to hide the bezel and the non-display region; and
   a reflection member provided between a front side of the bezel and the light refraction member.

\* \* \* \* \*